United States Patent
Kim et al.

(10) Patent No.: US 9,935,293 B2
(45) Date of Patent: Apr. 3, 2018

(54) ORGANIC LIGHT EMITTING DIODE DISPLAY

(71) Applicant: Samsung Display Co., Ltd., Yongin-si, Gyeonggi-do (KR)

(72) Inventors: Byoung Ki Kim, Seoul (KR); Hee Kyung Kim, Busan (KR); Il Hun Seo, Suwon-si (KR); Young Jun Shin, Seongnam-si (KR); Yun-Mo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/970,223

(22) Filed: Dec. 15, 2015

(65) Prior Publication Data

US 2016/0218324 A1     Jul. 28, 2016

(30) Foreign Application Priority Data

Jan. 28, 2015    (KR) ........................ 10-2015-0013812

(51) Int. Cl.
*H01L 29/08* (2006.01)
*H01L 51/52* (2006.01)
*H01L 27/32* (2006.01)

(52) U.S. Cl.
CPC ...... *H01L 51/5271* (2013.01); *H01L 27/3269* (2013.01); *H01L 27/3276* (2013.01)

(58) Field of Classification Search
CPC ............. H01L 27/3248; H01L 27/3269; H01L 27/3276; H01L 51/5271

USPC .......................................................... 257/40
See application file for complete search history.

(56) References Cited

U.S. PATENT DOCUMENTS

| 2013/0343087 A1 | 12/2013 | Huang |
| 2014/0009960 A1 | 1/2014 | Miyamoto et al. |
| 2014/0124761 A1* | 5/2014 | Jeon .................... H01L 27/3244 257/40 |

FOREIGN PATENT DOCUMENTS

| KR | 10-0527195 B1 | 11/2005 |
| KR | 10-2006-0131263 A | 12/2006 |
| KR | 10-1003669 B1 | 12/2010 |

* cited by examiner

*Primary Examiner* — Hung Vu
(74) *Attorney, Agent, or Firm* — Lewis Roca Rothgerber Christie LLP

(57) ABSTRACT

An organic light emitting diode display includes: a substrate; a gate line on the substrate; a data line crossing the gate line; a driving voltage line extending parallel with at least one of the gate line and the data line; a first thin film transistor coupled to the gate line and the data line and comprising a first semiconductor layer; a second thin film transistor coupled to the first thin film transistor and the driving voltage line and comprising a second semiconductor layer; and an organic light emitting element coupled to the second thin film transistor, wherein at least one of the gate line, the data line, and the driving voltage line comprise a plurality of layers, and the lowest layer of the plurality of layers comprises a first metal layer made of a reflective metal.

14 Claims, 12 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-013812 filed in the Korean Intellectual Property Office on Jan. 28, 2015, the entire contents of which are incorporated herein by reference.

BACKGROUND

1. Field

Aspects of embodiments of the present invention relate to an organic light emitting diode display.

2. Description of the Related Art

Display devices include, for example, a liquid crystal display (LCD), a plasma display panel (PDP), an organic light emitting diode device (OLED device), a field effect display (FED), an electrophoretic display device, and the like.

OLED devices includes two electrodes and an organic emission layer positioned therebetween and emit light while an electron injected from one electrode and a hole injected from the other electrode are coupled with each other in the organic emission layer to form an exciton and the exciton discharges energy.

Because OLED devices have a self-luminance characteristic and do not require a separate light source, unlike LCDs, the thickness and a weight of OLED devices may be relatively lower compared to LCDs. Further, because OLED devices have high-grade characteristics such as low power consumption, high luminance, and a high response speed, OLED devices have received attention as a next-generation display device.

In OLED devices, however, the pixels may tend to deteriorate over time, and in order to improve or maintain image quality, OLED devices may correct or compensate for deterioration of the pixels. For example, light emitted from the pixels may be received in an optical sensor unit to be analyzed and corrected.

However, if the light emitted from the pixel is transferred to the optical sensor unit, the deteriorated pixel may not be corrected.

The above information disclosed in this Background section is only for enhancement of understanding of the background of the invention and therefore it may contain information that does not constitute prior art.

SUMMARY

The present invention has been made in an effort to provide an organic light emitting diode display having characteristics of transferring light emitted from a pixel to an optical sensor unit without being extinguished so as to correct deteriorated pixels.

According to aspects of example embodiments, an organic light emitting diode display includes: a substrate; a gate line on the substrate; a data line crossing the gate line; a driving voltage line extending parallel with at least one of the gate line and the data line; a first thin film transistor coupled to the gate line and the data line and comprising a first semiconductor layer; a second thin film transistor coupled to the first thin film transistor and the driving voltage line and comprising a second semiconductor layer; and an organic light emitting element coupled to the second thin film transistor, wherein at least one of the gate line, the data line, and the driving voltage line comprise a plurality of layers, and a lowest layer of the plurality of layers comprises a first metal layer made of a reflective metal.

The plurality of layers may further include a second metal layer formed on the first metal layer.

The first metal layer may include at least one of aluminum (Al), silver (Ag), or copper (Cu).

The second metal layer may include at least one of molybdenum (Mo) or titanium (Ti).

The first and second metal layers of the plurality of layers may be arranged in an alternating order.

The organic light emitting diode display may further include a transparent metal layer below the first metal layer.

The transparent metal layer may include at least one of indium tin oxide (ITO) or indium zinc oxide (IZO).

The organic light emitting diode display may further include a light reflection pattern on the substrate in a region that does not overlap with the gate line, the data line, and the driving voltage line.

The light reflection pattern may be formed on a same layer as at least one of the gate line, the data line, and the driving voltage line.

The light reflection pattern may include: a third metal layer made of a reflective metal; and a fourth metal layer on the third metal layer.

The third metal layer may include at least one of aluminum (Al), silver (Ag), or copper (Cu).

The fourth metal layer may include at least one of molybdenum (Mo) or titanium (Ti).

The third and fourth metal layers of the light reflection pattern may be arranged in an alternating order.

The organic light emitting diode may further include a transparent metal layer below the light reflection pattern.

The light reflection pattern may include at least one of indium tin oxide (ITO) or indium zinc oxide (IZO).

According aspects of example embodiments of the present invention, it may be possible to prevent or reduce light emitted from the pixel from being extinguished while being transferred to the optical sensor unit.

DETAILED DESCRIPTION

Figure 1:
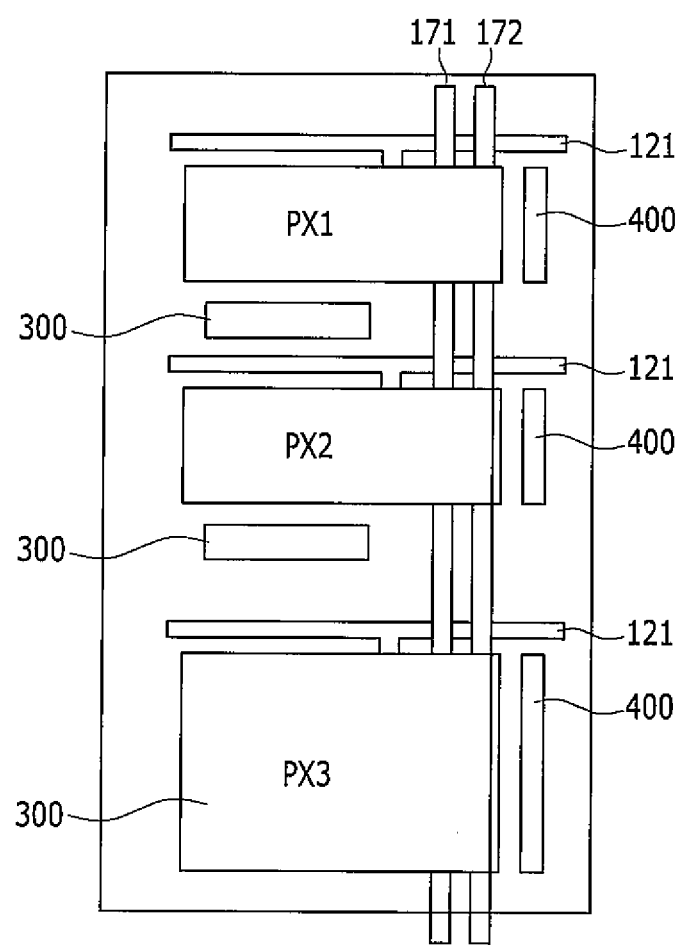
FIG. 1 is a schematic layout view illustrating an organic light emitting diode display, according to example embodiments of the present invention.

Hereinafter, example embodiments will be described in detail with reference to the accompanying drawings. As those skilled in the art would realize, the described embodiments may be modified in various different ways, all without departing from the spirit or scope of the present invention. On the contrary, example embodiments introduced herein are provided to make disclosed contents thorough and complete and sufficiently transfer the spirit to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present. Like reference numerals designate like elements throughout the specification.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an organic light emitting diode display according to an example embodiment will be described with reference to FIGS. 1 to 4.

Figure 2:
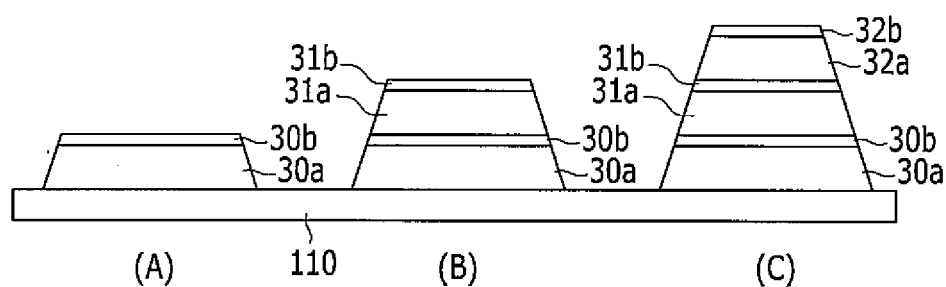
FIG. 2 is a cross-sectional view illustrating a laminated structure of wires of an organic light emitting diode display, according to example embodiments of the present invention.
Figure 3:
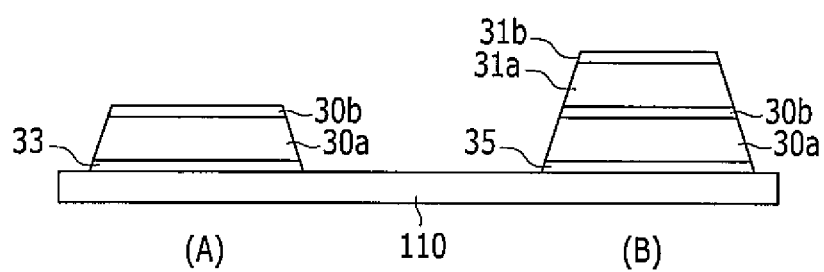
FIG. 3 is a diagram illustrating a laminated structure of wires of the organic light emitting diode display, according to example embodiments of the present invention.
Figure 4:
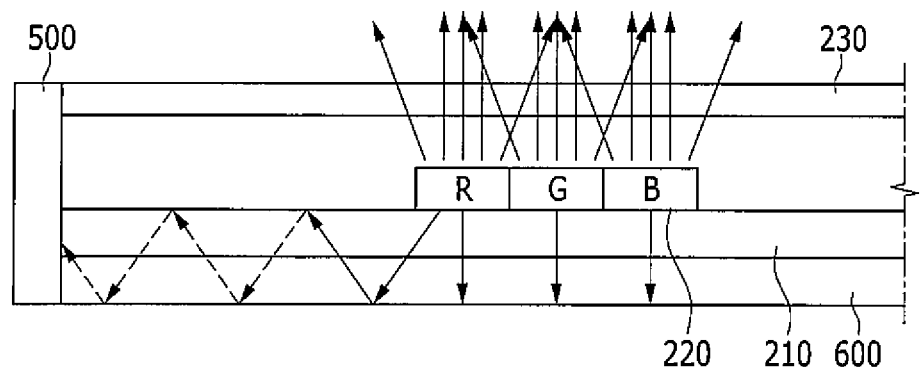
FIG. 4 is a diagram illustrating a process of transferring light generated in an organic light emitting element to an optical sensor unit, according to example embodiments of the present invention.

FIG. 1 is a schematic layout view illustrating an organic light emitting diode display, FIG. 2 is a cross-sectional view illustrating a laminated structure of wires of an organic light emitting diode display according to a first example embodiment of the present invention, FIG. 3 is a diagram illustrating a laminated structure of wires of the organic light emitting diode display according to a modified example of the first example embodiment of the present invention, and FIG. 4 is a diagram illustrating a process of transferring light generated in an organic light emitting element to an optical sensor unit.

Referring to FIG. 1, an organic light emitting diode display according to an example embodiment includes organic fight emitting elements PX1, PX2, and PX3, gate lines 121, data lines 171, and driving voltage lines 172.

The organic light emitting element is coupled to the gate line 121, the data line 171, and the driving voltage line 172 to emit light, thereby displaying an image. The organic light emitting element is configured by a plurality of sub pixels PX1, PX2, and PX3. The sub pixels PX1, PX2, and PX3 may correspond to a red sub pixel, a green sub pixel, and a blue sub pixel, respectively.

The organic light emitting element may include an organic material which uniquely emits any one or one or more of the primary colors such as three primary colors of red, green, and blue, and the organic light emitting diode display displays a desired image by a spatial sum of the colors.

The gate lines 121 transfer scanning signals, extend substantially in a row direction, are arranged substantially in parallel to each other, and may be made of metal with conductivity or any suitable conductive material. In addition, the data lines 171 transfer data signals, extend substantially in a column direction by crossing the gate lines 121, and may be arranged substantially in parallel to each other. Like the gate line 121, the data line 171 may also be made of metal having conductivity or any suitable conductive material.

The driving voltage line 172 transfers a driving voltage and may be arranged to be parallel with at least one of the gate line 121 and the data line 171. In the example embodiment of the present invention, the driving voltage line 172 is arranged to be parallel with the data line 171 to extend substantially in a column direction. In this case, the driving voltage line 172 may also be made of metal having conductivity.

According to the first example embodiment of the present invention, at least one of the gate line 121, the data line 171, and the driving voltage line 172 may be formed by a plurality of layers. In this case, a reflective metal layer is formed or arranged on the lowest layer of the plurality of layers. The reflective metal layer is formed or arranged on the lowest layer of the plurality of layers to reflect light emitted from the organic light emitting element. The light emitted from the organic light emitting element is not absorbed but reflected by the reflective metal layer to transfer the light to the optical sensor unit 500 to be described below. A process of transferring the light to the optical sensor unit 500 will be described below.

Referring to FIG. 2A, one wire of the organic light emitting diode display according to the first example embodiment includes a first metal layer 30*a* and a second metal layer 30*b*.

The first metal layer 30*a* as a metal layer positioned on the lowest portion of the wire may be made of reflective metal as described above. For example, the first metal layer 30*a* may include at least one of aluminum (Al), silver (Ag), and copper (Cu). That is, the first metal layer 30*a* may be formed of only one metal among the metals or in combination of two or more of the metals.

The second metal layer 30*b* may include at least one of molybdenum (Mo) and titanium (Ti). That is, the second metal layer 30*b* may be formed of only one metal among the metals or in combination of two or more of the metals.

For example, according to some example embodiments of the present invention, each of the first metal layer 30*a* and the second metal layer 30*b* may be made of aluminum (Al) and molybdenum (Mo).

Meanwhile, in the first example embodiment of the present invention, the first metal layer 30*a* and the second metal layer 30*b* described above may be alternately formed. As illustrated in FIG. 2B, the first and second metal layers may be alternately laminated two times. For example, the wire may be formed by laminating aluminum/molybdenum/aluminum/molybdenum in sequence. As illustrated in FIG. 2C, the first and second metal layers 30*a* and 30*b* may be alternately laminated three times. In this case, the wire may be formed by laminating aluminum/molybdenum/aluminum/molybdenum/aluminum/molybdenum in sequence. As the first and second metal layers 30*a* and 30*b* may be alternately formed, in an etching process in which a wire pattern is formed, instances of an undercut and the like, which are generated on the metal layer, may be prevented or reduced from being formed.

Meanwhile, referring to FIG. 3, a transparent metal layer 33 may be further included below the first metal layer 30*a*. The transparent metal layer 33 prevents or reduces instances of a metal material included in the first metal layer 30*a* from being diffused into the lower portion. The transparent metal layer 33 prevents or reduces instances of the first metal layer 30*a* positioned at the lowest portion of the wire from directly contacting an insulating layer positioned at the lower portion. That is, by the transparent metal layer 33, the metal material included in the first metal layer 30*a* may be prevented from being diffused into the insulating layer. For example, the transparent metal layer 33 may prevent or reduce instances of aluminum (Al) included in the first metal layer 30*a* from being diffused into the insulating layer positioned below the wire.

In this case, the transparent metal layer 33 is made of a transparent metal to still reflect the light emitted from the organic light emitting element. In the present invention, the transparent metal layer 33 may be made of indium tin oxide (ITO) or indium zinc oxide (IZO).

Referring back to FIG. 1, organic light emitting diode displays according to second and third example embodiments may further include light reflection patterns 300 and 400. The light reflection patterns 300 and 400 are arranged in regions which do not overlap with the gate line 121, the data line 171, and the driving voltage line 172 in the organic light emitting diode display. The light reflection patterns 300 and 400 may reflect the light emitted from the organic light emitting element. As described above, except that the lowest layer of at least one of the gate line 121, the data line 171, and the driving voltage line 172 is made of a reflective metal, the light reflection patterns 300 and 400 are additionally arranged in the regions, thereby more efficiently reflecting the light emitted from the organic light emitting element. A layout view of the organic light emitting diode display in which the light reflection patterns 300 and 400 are arranged will be described below in more detail with reference to FIGS. 5 to 12.

The light reflection patterns 300 and 400 may be formed on the same layer as at least one of the gate line 121, the data line 171, and the driving voltage line 172. For example, the light reflection patterns 300 and 400 may be formed on the same layer on the gate line 121. In this case, the light reflection patterns 300 and 400 may be formed by the same structure as the gate line 121, which is configured by the aforementioned first and second metal layers 30*a* and 30*b*.

Additionally, the light reflection patterns 300 and 400 may be formed on the same layer as the data line 171 or the driving voltage line 172 to be formed by the same structure described above.

According to some embodiments of the present invention, the light reflection patterns 300 and 400 include a third metal layer and a fourth metal layer. The third metal layer and the fourth metal layer of the light reflection patterns 300 and 400 correspond to the first metal layer 30*a* and the second metal layer 30*b* described above, respectively.

That is, the third metal layer may be made of a reflective metal. For example, the third metal layer may include at least one of aluminum (Al), silver (Ag), and copper (Cu). That is, the third metal layer may be formed of only one metal of the metals or in combination of two or more of the metals.

The fourth metal layer may include at least one of molybdenum (Mo) and titanium (Ti). That is, the fourth metal layer may be formed of only one metal of the metals or in combination of two or more of the metals.

According to some example embodiments of the present invention, each of the third metal layer and the fourth metal layer may be made of aluminum (Al) and molybdenum (Mo).

Meanwhile, in the second and third example embodiments of the present invention, the third and fourth metal layers described above may be alternately formed. For example, the third and fourth metal layers may be alternately laminated two times. In this case, the light reflection patterns 300 and 400 may be formed by laminating aluminum/molybdenum/aluminum/molybdenum in sequential or alternating order. Alternatively, the third and fourth metal layers may be alternately formed three times. In this case, the light reflection patterns may be formed by laminating aluminum/molybdenum/aluminum/molybdenum/aluminum/molybdenum in sequential or alternating order. As the third and fourth metal layers may be alternately formed, in an etching process in which a pattern is formed, instances of an undercut being formed on the metal layer may be prevented or reduced.

Further, a transparent metal layer may be formed below the third metal layer of the light reflection patterns 300 and 400. The transparent metal layer of the light reflection patterns 300 and 400 corresponds to the transparent metal layer 33 positioned below the aforementioned wire.

That is, the transparent metal layer may prevent or reduce instances of a metal material included in the third metal layer from being diffused into the lower portion. The transparent metal layer may prevent or reduce instances of the third metal layer positioned at the lowest portion of the wire from directly contacting the insulating layer positioned at the lower portion. The transparent metal layer may prevent or reduce instances of the metal material included in the third metal layer from being diffused into the insulating layer. For example, the transparent metal layer may prevent or reduce instances of aluminum (Al) included in the third metal layer from being diffused into the insulating layer positioned below the wire.

In this case, the transparent metal layer is made of a transparent metal or conductive material to reflect the light emitted from the organic light emitting element. In the present invention, the transparent metal or conductive material layer may be made of indium tin oxide (ITO) or indium zinc oxide (IZO).

Meanwhile, referring to FIG. 4, the organic light emitting diode display may include an optical sensor unit 500. The optical sensor unit 500 is arranged on a circumference of a display panel of the organic light emitting diode display to receive the light emitted from the organic light emitting element. The optical sensor unit 500 measures luminance of the light in the organic light emitting element through the received light to detect a specific deteriorated organic light emitting element among a plurality of organic light emitting elements or determine a position of the specific deteriorated organic light emitting element. Meanwhile, the deteriorated organic light emitting element may be corrected to emit normal light by a controller coupled to (e.g., electrically coupled to or in electronic communication with) the optical sensor unit 500.

In a top emissive display device, the light emitted from an organic light emitting element 220 may be discharged forward through a window 230. In addition, a part of the light emitted from the organic light emitting element 220 may be discharged backward. By repeating a process in which the light discharged backward is reflected to the light guide plate 600 positioned at the lowest portion and the reflected light is reflected again by a substrate 210 where a metal wire made of the aforementioned reflective layer is positioned, the light may reach the optical sensor unit 500.

According to the first to third example embodiments of the present invention, a lower part of at least one of the gate line 121, the data line 171, and the driving voltage line 172 is made of a reflective metal or reflective conductive material, the light reflection patterns 300 and 400 are arranged in the regions where the gate line 121, the data line 171, and the driving voltage line 172 are not formed, and as a result, the light emitted from the organic light emitting element may reach the optical sensor unit 500.

Hereinafter, in the organic light emitting diode display according to the second example embodiment of the present invention, a structure in which the light reflection patterns 300 and 400 are formed will be described in more detail with reference to FIGS. 5 to 9.

Figure 5:
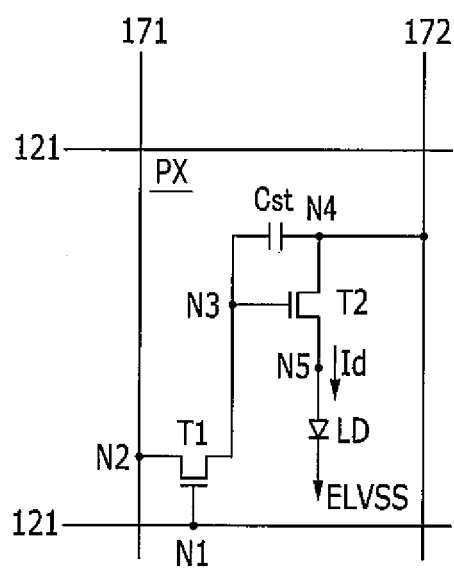
FIG. 5 is an equivalent circuit diagram of one pixel of the organic light emitting diode display, according to example embodiments of the present invention.
Figure 6:
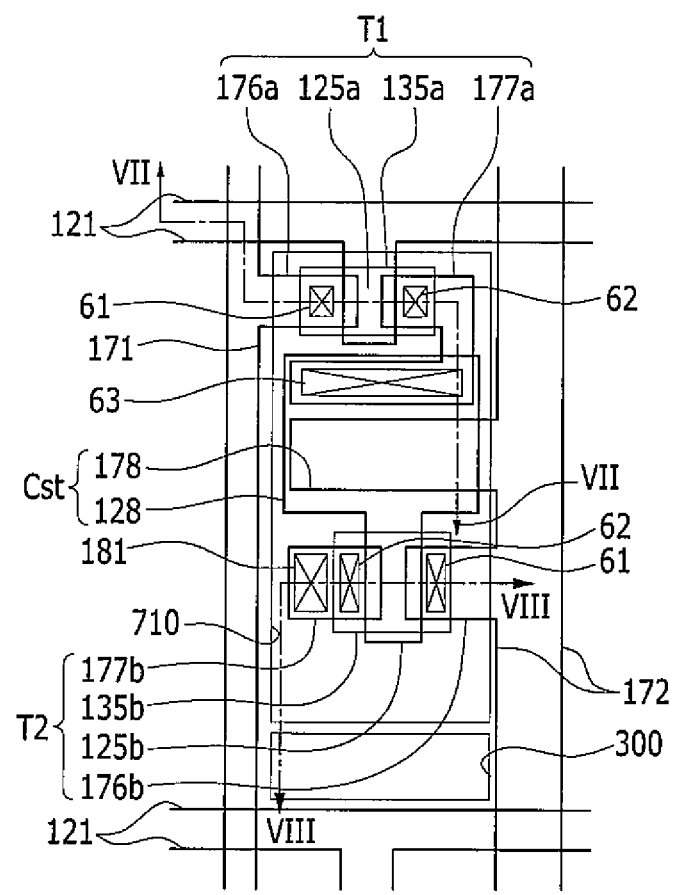
FIG. 6 is a layout view illustrating one pixel of an organic light emitting diode display, according to example embodiments of the present invention.
Figure 7:
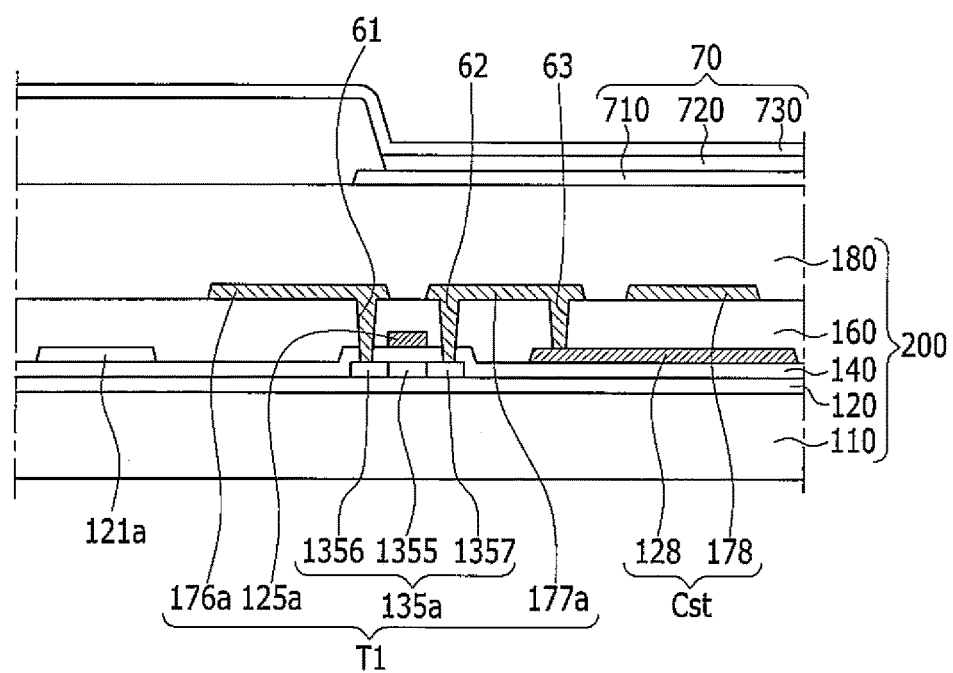
FIG. 7 is a cross-sectional view of the display device taken along the line VII-VII of FIG. 6.
Figure 8:
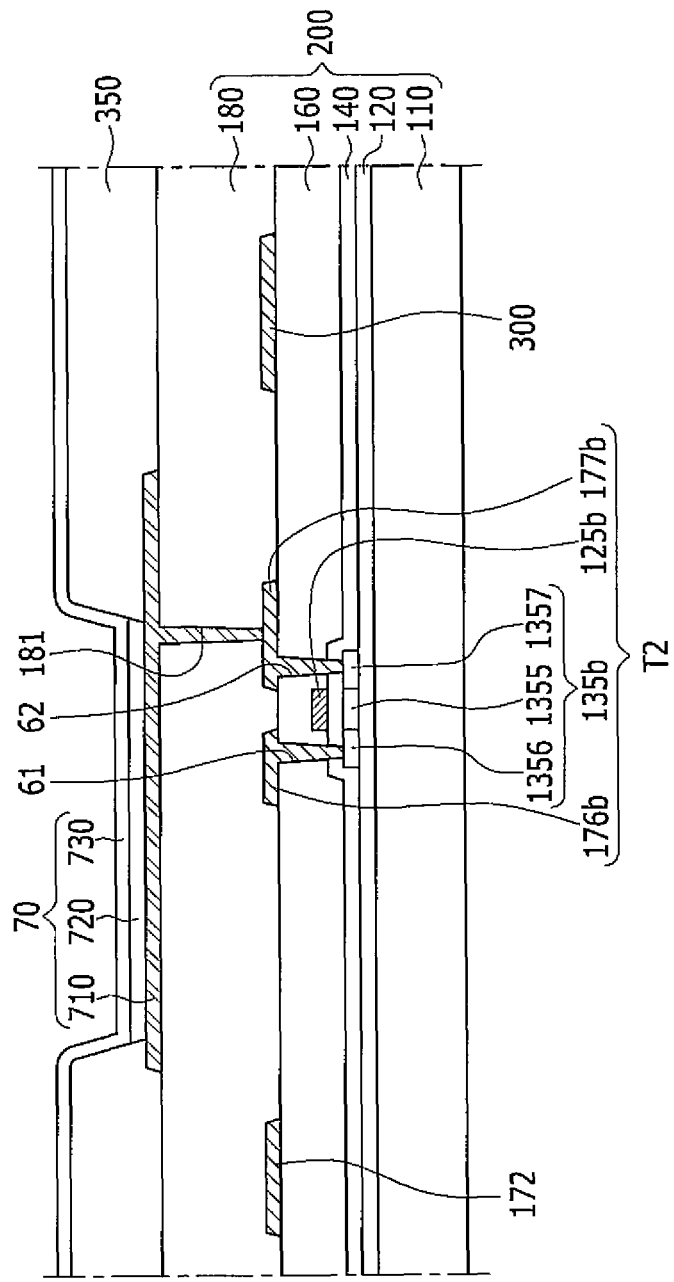
FIG. 8 is a cross-sectional view of the display device taken along the line VIII-VIII of FIG. 6.
Figure 9:
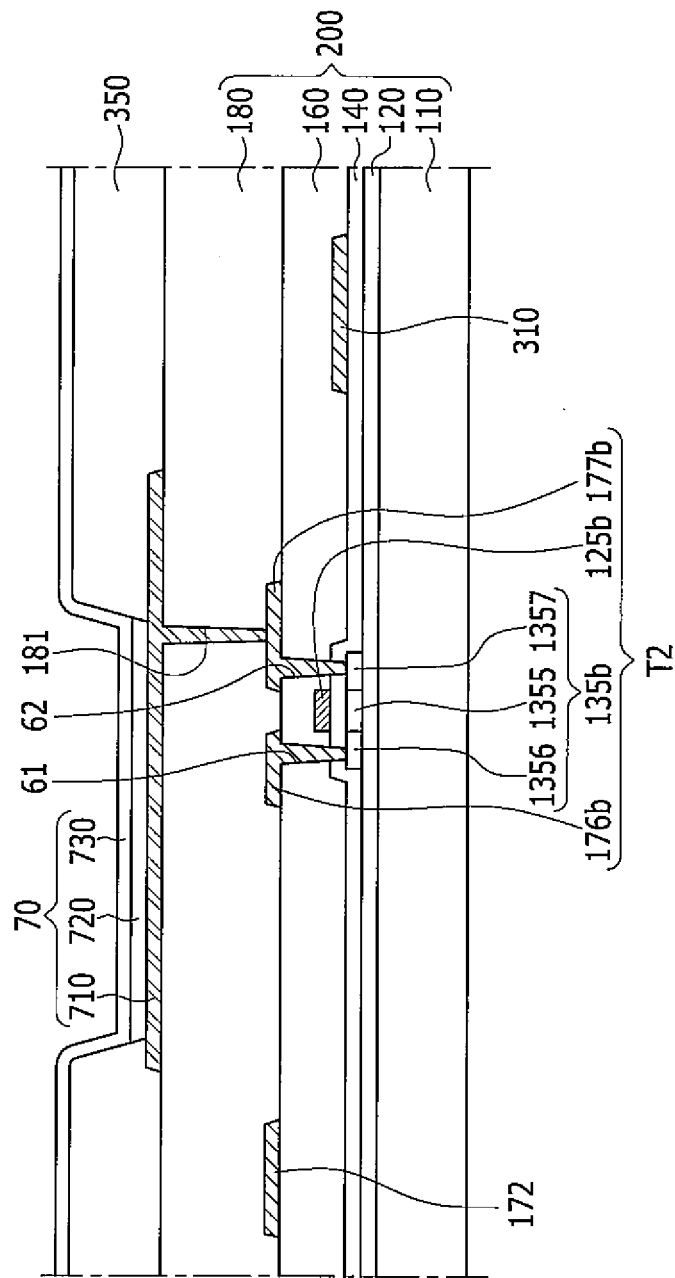
FIG. 9 is a cross-sectional view of the organic light emitting diode display according to an example embodiment of the present invention as illustrated in FIG. 8.

FIG. 5 is an equivalent circuit diagram of one pixel of the organic light emitting diode display, FIG. 6 is a layout view illustrating one pixel of an organic light emitting diode display according to a second example embodiment of the present invention, FIG. 7 is a cross-sectional view of the display device taken along the line VII-VII of FIG. 6, FIG. 8 is a cross-sectional view of the display device taken along the line VIII-VIII of FIG. 6, and FIG. 9 is a cross-sectional view of the organic light emitting diode display according to a modified example of the second example embodiment illustrated in FIG. 8.

Referring to FIG. 5, the organic light emitting diode display includes a plurality of signal lines 121, 171, and 172, and a pixel PX coupled thereto. Here, the pixel PX may be one of a red pixel R, a green pixel G, and a blue pixel B.

The signal lines includes a gate line 121 transferring a scanning signal, a data line 171 transferring a data signal, a driving voltage line 172 transferring driving voltage, and the like.

The gate lines 121 extend substantially in a row direction and are substantially parallel to each other, and the data lines 171 extend substantially in a column direction and are substantially parallel to each other. The driving voltage lines 172 extend substantially in a column direction, but may extend in a row direction or a column direction or be formed in a net shape.

In this case, one pixel PX includes a thin film transistor including a switching transistor T1 and a driving transistor T2, a storage capacitor Cst, and an organic light emitting element LD. The pixel PX may further include a thin film transistor and a capacitor in order to compensate for a current provided to the organic light emitting element.

A switching transistor T1 includes a control terminal N1, an input terminal N2, and an output terminal N3. In this case, the control terminal N1 is coupled to the gate line 121, the input terminal N2 is coupled to the data line 171, and the output terminal N3 is coupled to the driving transistor T2.

The switching transistor T1 transfers a data signal received from the data line 171 to the driving transistor T2 in response to a scanning signal received from the gate line 121.

In addition, the driving transistor T2 also includes a control terminal N3, an input terminal N4, and an output terminal N5. In this case, the control terminal N3 is coupled to the switching transistor T1, the input terminal N4 is coupled to the driving voltage line 172, and the output terminal N5 is coupled to the organic light emitting element LD.

The driving transistor T2 runs an output current Id of which amplitude varies according to a voltage applied between the control terminal N3 and the output terminal N5.

In this case, the capacitor Cst is coupled between the control terminal N3 and the input terminal N4 of the driving transistor T2. Here, the capacitor Cst charges the data signal applied to the control terminal N3 of the driving transistor T2, and maintains the charged data signal even after the switching transistor T1 is turned off.

Meanwhile, the organic light emitting element LD, for example, as an organic light emitting diode (OLED), has an anode coupled to the output terminal N5 of the driving transistor T2 and a cathode coupled to a common voltage Vss. The organic light emitting element LD emits light by varying intensities according to the output current Id of the driving transistor T2 to display an image.

The organic light emitting element LD may include an organic material that uniquely emits any one or one or more of the primary colors such as three primary colors of red, green, and blue, and the organic light emitting diode display displays a desired image by a spatial sum of the colors.

The switching transistor T1 and the driving transistor T2 are n-channel field effect transistors (FET), but at least one thereof may be a p-channel field effect transistor. Further, a connection relationship among the transistors T1 and T2, the capacitor Cst, and the organic light emitting element LD may be changed.

A structure of the organic light emitting diode display according to the second example embodiment will be described in more detail with reference to FIGS. 6 to 9.

Referring to FIGS. 6 to 8, a substrate 110 may be formed as an insulation substrate made of any suitable insulating substrate material such as glass, quartz, ceramic, plastic, and the like.

In addition, a buffer layer 120 is formed on the substrate 110. The buffer layer 120 may be formed as a single layer of silicon nitride (SiNx) or a double-layer structure in which silicon nitride (SiNx) and silicon oxide ($SiO_2$) are laminated. The buffer layer 120 serves to planarize a surface while preventing an unnecessary component such as impurities or moisture from permeating.

A switching semiconductor layer 135a and a driving semiconductor layer 135b are formed on the buffer layer 120 to be spaced apart from each other.

The semiconductor layers 135a and 135b may be made of polysilicon or oxide semiconductor. In this case, the oxide semiconductor may include any one of oxides based on titanium (Ti), hafnium (Hf), zirconium (Zr), aluminum (Al), tantalum (Ta), germanium (Ge), zinc (Zn), gallium (Ga), tin (Sn), or indium (In), and zinc oxide (ZnO), indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof.

In the case where the semiconductor layers 135a and 135b are formed of the oxide semiconductor, in order to protect the oxide semiconductor vulnerable to an external environment such as a high temperature, a separate passivation layer may be added.

The semiconductor layers 135a and 135b include a channel region in which impurities are not doped, and a source region and a drain region formed when impurities are doped to two sides of the channel region. Herein, the impurities vary according to a kind of thin film transistor, and may be N-type impurities or P-type impurities.

The switching semiconductor layer 135a and the driving semiconductor layer 135b are divided into a channel region 1355, and a source region 1356 and a drain region 1357 formed at both sides of the channel region 1355.

The channel region 1355 of the switching semiconductor layer 135a and the driving semiconductor layer 135b may include polysilicon on which impurities are not doped, that is, an intrinsic semiconductor.

In addition, the source region 1356 and the drain region 1357 of the switching semiconductor layer 135a and the driving semiconductor layer 135b may include polysilicon on which impurities are doped, that is, an impurity semiconductor.

A gate insulating layer 140 is formed on the switching semiconductor layer 135a and the driving semiconductor layer 135b. The gate insulating layer 140 may be a single layer or a multilayer including at least one of silicon nitride and silicon oxide.

Referring to FIG. 7, on the gate insulating layer 140, a gate line 121a, a driving gate electrode 125a, and a first capacitor electrode 128 are formed.

The gate line 121 extends in a horizontal direction to transfer a scan signal to the switching transistor T1. In this case, the gate line 121 includes a switching gate electrode 125a protruding to the switching semiconductor layer 135a.

The driving gate electrode 125b protrudes from the first capacitor electrode 128 to the driving semiconductor layer 135b. Each of the switching gate electrode 125a and driving gate electrode 125b overlaps with the channel region 1355.

Meanwhile, on the gate line 121, the driving gate electrode 125b, and the first capacitor electrode 128, an interlayer insulating layer 160 is formed. Like the gate insulating layer 140, the interlayer insulating layer 160 may be made of silicon nitride, silicon oxide, or the like.

In the interlayer insulating layer 160 and the gate insulating layer 140, a source contact hole 61 and a drain contact hole 62 exposing the source region 1356 and the drain region 1357, respectively, are formed, and a storage contact hole 63 exposing a part of the first capacitor electrode 128 is formed.

On the interlayer insulating layer 160, a data line 171 having a switching source electrode 176a, a driving voltage line 172 having a driving source electrode 176b and a second storage capacitor 178, and a switching drain electrode 177a and a driving drain electrode 177b coupled with the first capacitor electrode 128 are formed.

The data line 171 transfers a data signal and extends in a direction to cross the gate line 121. The driving voltage line 172 transfers a driving voltage and is separated from the data line 171 to extend in the same direction as the data line 171.

The switching source electrode 176a protrudes toward the switching semiconductor layer 135a from the data line 171, and the driving source electrode 176b protrudes toward the driving semiconductor layer 135b from the driving voltage line 172.

Each of the switching source electrode 176a and the driving source electrode 176b is coupled to the source region 1356 through the source contact hole 61. The switching drain electrode 177a faces the switching source electrode 176a, and the driving drain electrode 177b faces the driving source electrode 176b.

In addition, each of the switching drain electrode 177a and the driving drain electrode 177b is coupled with the drain region 1357 through the drain contact hole 62.

The switching drain electrode 177a is extended to be electrically coupled with the first capacitor electrode 128 and the driving gate electrode 125b through the contact hole 63 formed in the interlayer insulating layer 160.

The second capacitor electrode 178 protrudes from the driving voltage line 172 to overlap with the first capacitor electrode 128. Accordingly, the first capacitor electrode 128 and the second capacitor electrode 178 form the storage capacitor Cst by using the interlayer insulating layer 160 as a dielectric material.

The switching semiconductor layer 135a, the switching gate electrode 125a, the switching source electrode 176a, and the switching drain electrode 177a form the switching transistor T1. Meanwhile, the driving semiconductor layer 135b, the driving gate electrode 125a, the driving source electrode 176b, and the driving drain electrode 177b form the driving transistor T2.

The switching transistor T1 and the driving transistor T2 correspond to switching elements.

On the switching source electrode 176*a*, the driving source electrode 176*b*, the switching drain electrode 177*a*, and the driving drain electrode 177*b*, a passivation layer 180 is formed.

A pixel electrode 710 is formed on the passivation layer 180. In this case, the pixel electrode 710 may be made of a transparent conductive material such as indium tin oxide (ITO), indium zinc oxide (IZO), zinc oxide (ZnO), or indium oxide (In$_2$O$_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The pixel electrode 710 is electrically coupled with the driving drain electrode 177*b* of the driving transistor T2 through a contact hole 181 formed in the interlayer insulating layer 160 to become an anode of the organic light emitting diode 70.

A pixel defining layer 350 is formed on the passivation layer 180 and an edge of the pixel electrode 710. The pixel defining layer 350 has an opening exposing the pixel electrode 710. The pixel defining layer 350 may include a resin such as polyacrylates or polyimides, a silica-based inorganic material, and the like.

An organic emission layer 720 is formed in the opening of the pixel defining layer 350. The organic emission layer 720 is formed in a multilayer including one or more layers of an emission layer, a hole-injection layer (HIL), a hole-transporting layer (HTL), an electron-transporting layer (ETL), and an electron-injection layer (EIL).

When the organic emission layer 720 includes all of the layers, the HIL is positioned on the pixel electrode 710 which is an anode, and the HTL, the emission layer, the ETL, and the EIL may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are formed in a red pixel, a green pixel, and a blue pixel, respectively, thereby implementing a color image.

Further, in the organic emission layer 720, all of the red organic emission layer, the green organic emission layer, and the blue organic emission layer are together laminated on the red pixel, the green pixel, and the blue pixel, and a red color filter, a green color filter, and a blue color filter are formed for each pixel, thereby implementing a color image.

As another example, white organic emission layers emitting white light are formed in each of the red pixel, the green pixel, and the blue pixel, and a red color filter, a green color filter, and a blue color filter are formed for each pixel, thereby implementing the color image. In the case of implementing the color image by using the white organic emission layer and the color filter, a deposition mask for depositing the red organic emission layer, the green organic emission layer, and the blue organic emission layer on respective pixels, that is, the red pixel, the green pixel, and the blue pixel does not need to be used.

The white organic emission layer described in another example may be formed by one organic emission layer, and also includes a configuration formed so as to emit white light by laminating a plurality of organic emission layers. For example, the white organic emission layer may include a configuration which may emit white light by combining at least one yellow organic emission layer and at least one blue organic emission layer, a configuration which may emit white light by combining at least one cyan organic emission layer and at least one red organic emission layer, a configuration which may emit white light by combining at least one magenta organic emission layer and at least one green organic emission layer, and the like.

A common electrode 730 is formed on the pixel defining layer 350 and the organic emission layer 720. The common electrode 730 may be made of a transparent conductive material such as indium tin oxide (ITO), indium zinc oxide (IZO), zinc oxide (ZnO), or indium oxide (In$_2$O$_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 becomes a cathode of the organic light emitting diode 70. The pixel electrode 710, the organic emission layer 720, and the common electrode 730 form the organic light emitting diode 70.

An overcoat protecting the organic light emitting diode 70 may be formed on the common electrode 730.

Referring to FIGS. 6 and 8, in the second example embodiment of the present invention, a light reflection pattern 300 is formed in a region which does not overlap with the gate line 121, the data line 171, and the driving voltage line 172 in the pixel. In this case, the light reflection pattern 300 may be positioned between the pixel electrode 710 and the gate line 121.

In addition, the light reflection pattern 300 may be formed on the same layer as the data line 171. The light reflection patterns 300 and 400 may be formed by the same structure as the data line 171, which is configured by the aforementioned first and second metal layers 30*a* and 30*b*.

The light reflection patterns 300 and 400 include a third metal layer and a fourth metal layer as described above. The third metal layer may be made of a reflective metal. For example, the third metal layer may include at least one of aluminum (Al), silver (Ag), and copper (Cu). That is, the third metal layer may be formed of only one metal of the metals or in combination of two or more of the metals.

The fourth metal layer may include at least one of molybdenum (Mo) and titanium (Ti). That is, the fourth metal layer may be formed of only one metal of the metals or in combination of two or more of the metals.

According to some example embodiments of the present invention, each of the third metal layer and the fourth metal layer may be made of aluminum (Al) and molybdenum (Mo).

Meanwhile, the third and fourth metal layers may be alternately formed. For example, the third and fourth metal layers may be alternately laminated two times. In this case, the light reflection patterns 300 and 400 may be formed by laminating aluminum/molybdenum/aluminum/molybdenum in sequential or alternating order. Alternatively, the third and fourth metal layers may be alternately formed three times. In this case, the light reflection patterns may be formed by laminating aluminum/molybdenum/aluminum/molybdenum/aluminum/molybdenum in sequential or alternating order. As the third and fourth metal layers may be alternately formed, in an etching process in which a pattern is formed, instances of an undercut being formed on the metal layer may be prevented or reduced.

Further, a transparent metal layer may be formed below the third metal layer of the light reflection patterns 300 and 400. That is, the transparent metal layer prevents or reduces instances of a metal material included in the third metal layer from being diffused into the lower portion. The transparent metal layer prevents or reduces instances of the third metal layer positioned at the lowest portion of the wire from directly contacting the insulating layer positioned at the lower portion. The transparent metal layer may prevent or reduce instances of the metal material included in the third metal layer from being diffused into the insulating layer. For example, the transparent metal layer may prevent or reduce instances of aluminum (Al) included in the third metal layer from being diffused into the insulating layer positioned below the wire.

In this case, the transparent metal layer is made of a transparent metal to reflect the light emitted from the organic light emitting element. In the present invention, the transparent metal layer may be made of indium tin oxide (ITO) or indium zinc oxide (IZO).

Referring to FIG. 9, as a modified example of the second example embodiment of the present invention, a light reflection pattern 310 may be formed on the same layer as the gate line 121. That is, unlike FIG. 8, in FIG. 9, there is a difference in a formation position of the light reflection pattern 310. However, a laminated structure of the light reflection pattern 310 is the same as the aforementioned light reflection pattern 300. A detailed description thereof will be omitted.

Hereinafter, an organic light emitting diode display according to a third example embodiment will be described with reference to FIGS. 10 to 12. When describing the organic light emitting diode display according to the third example embodiment of the present invention, a detailed description for the same configuration as the aforementioned display device will be omitted.

Figure 10:
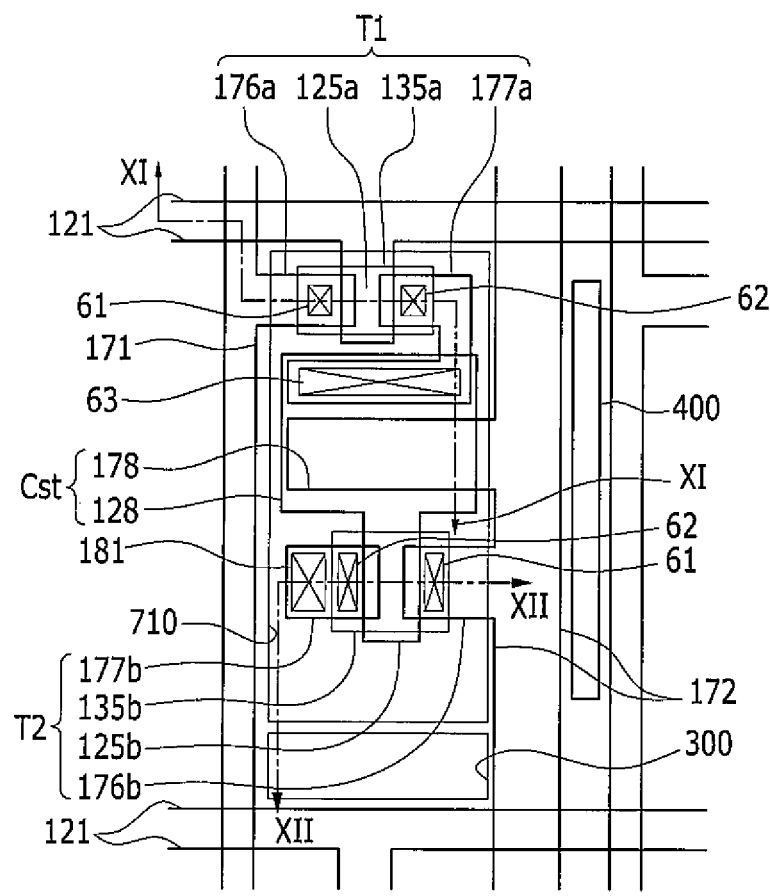
FIG. 10 is a layout view illustrating one pixel of an organic light emitting diode display, according to example embodiments of the present invention.
Figure 11:
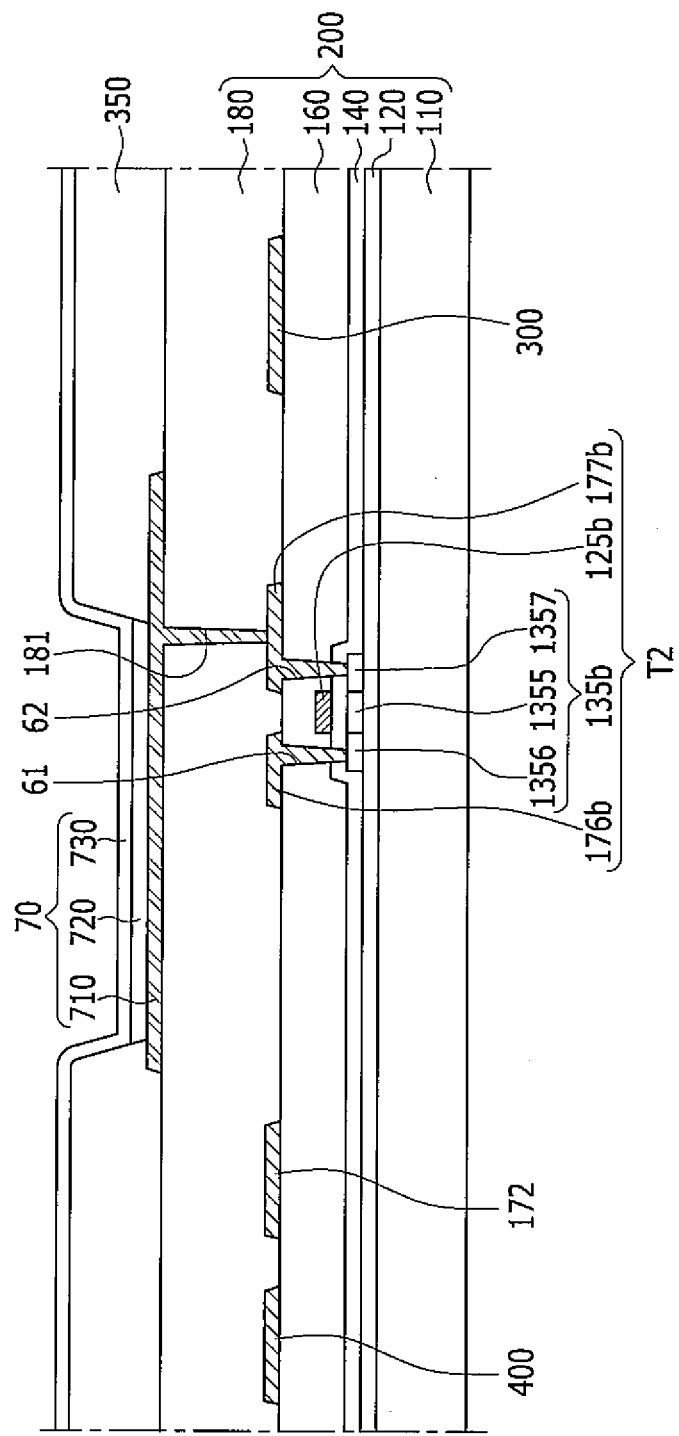
FIG. 11 is a cross-sectional view of the display device taken along the line XI-XI of FIG. 10.
Figure 12:
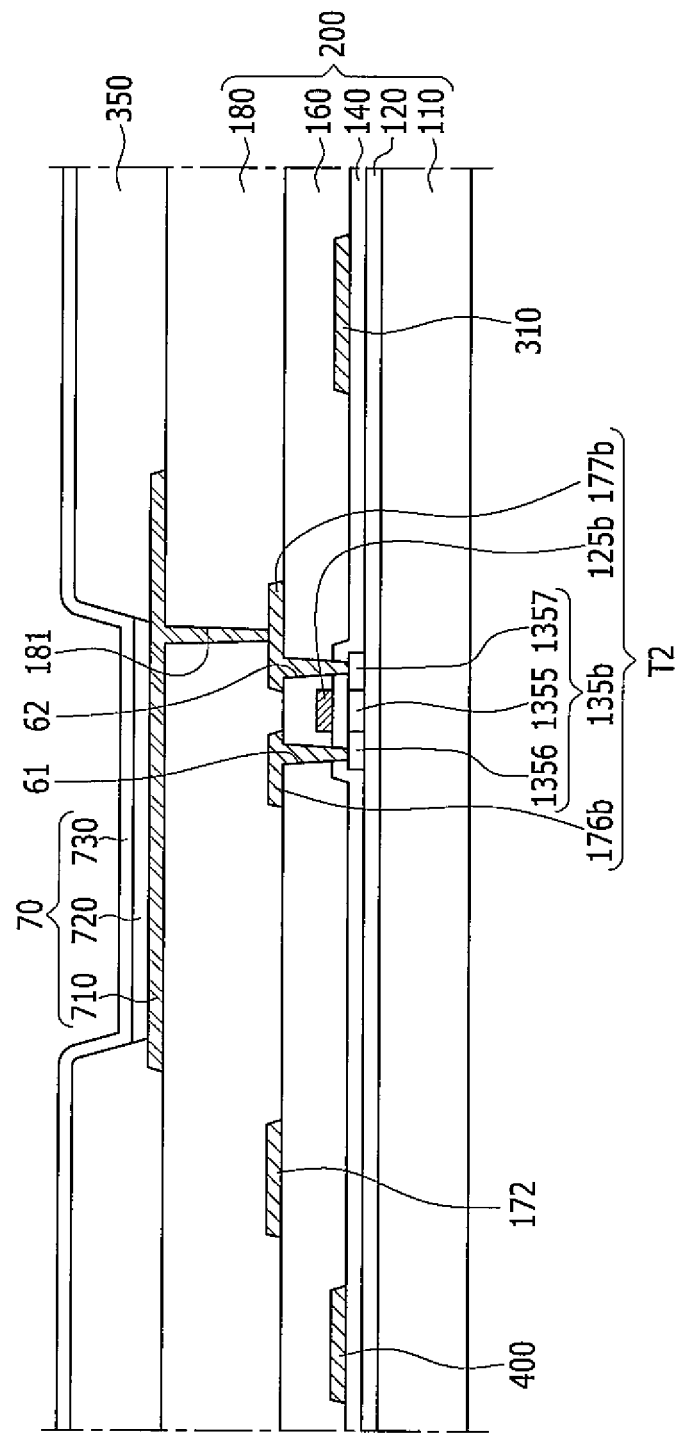
FIG. 12 is a cross-sectional view of the organic light emitting diode display according to an example embodiment of the present invention as illustrated in FIG. 11.

FIG. 10 is a layout view illustrating one pixel of an organic light emitting diode display according to a third example embodiment of the present invention, FIG. 11 is a cross-sectional view of the display device taken along line the XI-XI of FIG. 10, and FIG. 12 is a cross-sectional view of the organic light emitting diode display according to a modified example of the third example embodiment illustrated in FIG. 11.

Referring to FIGS. 10 and 11, a light reflection pattern 400 may be additionally arranged between the driving voltage line 172 of one pixel and the data line 171 of an adjacent pixel. That is, in the second example embodiment, the light reflection pattern 300 is formed only between the pixel electrode 710 and the gate line 121, but in the third example embodiment, additionally, the light reflection pattern 400 may be formed between the driving voltage line 172 of one pixel and the data line 171 of an adjacent pixel.

Referring to FIG. 11, the light reflection pattern 400 may be formed on the same layer as the data line 171 or the driving voltage line 172. For example, the light reflection pattern 400 may be formed by the same structure as the data line 171 or the driving voltage line 172 which is configured by the aforementioned first and second metal layers 30a and 30b.

The light reflection pattern 400 includes a third metal layer and a fourth metal layer as described above. The third metal layer may be made of a reflective metal or conductive material. In addition, the third and fourth metal layers may be alternately formed. Further, a transparent metal layer may be formed below the third metal layer of the light reflection pattern 400. That is, the transparent metal layer prevents or reduces instances of a metal material included in the third metal layer from being diffused into the lower portion.

Referring to FIG. 12, as a modified example of the third example embodiment of the present invention, a light reflection pattern 410 may be formed on the same layer as the gate line 121. That is, unlike FIG. 11, in FIG. 12, there is a difference in a formation position of the light reflection pattern 410. However, a laminated structure of the light reflection pattern 410 is the same as the aforementioned light reflection pattern 400. A detailed description thereof will be omitted.

In the organic light emitting diode display according to the example embodiment of the present invention, the gate line 121, the data line 171, and the driving voltage line 172 are configured by a plurality of layers of which the lower layer is made of a reflective metal, thereby efficiently transferring the light emitted from the organic light emitting element to the optical sensor unit 500.

Further, in the organic light emitting diode display, in the region that does not overlap with the gate line 121, the data line 171, and the driving voltage line 172, the light reflection patterns 300 and 400 having the same structure as the wire are arranged to more efficiently transfer the light emitted from the organic light emitting element to the optical sensor unit.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims, and their equivalents.

| Description of some of the symbols | |
|---|---|
| 121 Gate line | 171 Data line |
| 172 Driving voltage line | 30a First metal layer |
| 30b Second metal layer | 33 Transparent metal layer |
| 300, 400 Light reflection pattern | 500 Optical sensor unit |
| 600 Light guide plate | |

What is claimed is:

1. An organic light emitting diode display, comprising:
a substrate;
a gate line on the substrate;
a data line crossing the gate line;
a driving voltage line extending parallel with at least one of the gate line and the data line;
a first thin film transistor coupled to the gate line and the data line and comprising a first semiconductor layer;
a second thin film transistor coupled to the first thin film transistor and the driving voltage line and comprising a second semiconductor layer;
an organic light emitting element coupled to the second thin film transistor,
wherein at least one of the gate line, the data line, and the driving voltage line comprise a plurality of layers, and
a lowest layer of the plurality of layers comprises a first metal layer made of a reflective metal; and
a transparent metal layer below the first metal layer.

2. The organic light emitting diode display of claim 1, wherein the plurality of layers further comprises a second metal layer formed on the first metal layer.

3. The organic light emitting diode display of claim 2, wherein the first metal layer comprises at least one of aluminum (Al), silver (Ag), or copper (Cu).

4. The organic light emitting diode display of claim 2, wherein the second metal layer comprises at least one of molybdenum (Mo) or titanium (Ti).

5. The organic light emitting diode display of claim 2, wherein the first and second metal layers of the plurality of layers are arranged in an alternating order.

6. The organic light emitting diode display of claim 1, wherein the transparent metal layer comprises at least one of indium tin oxide (ITO) or indium zinc oxide (IZO).

7. The organic light emitting diode display of claim 1, further comprising a light reflection pattern on the substrate in a region that does not overlap with the gate line, the data line, and the driving voltage line.

8. The organic light emitting diode display of claim 7, wherein the light reflection pattern is formed on a same layer as at least one of the gate line, the data line, and the driving voltage line.

9. The organic light emitting diode display of claim 7, wherein the light reflection pattern comprises:
   a third metal layer made of a reflective metal; and
   a fourth metal layer on the third metal layer.

10. The organic light emitting diode display of claim 9, wherein the third metal layer comprises at least one of aluminum (Al), silver (Ag), or copper (Cu).

11. The organic light emitting diode display of claim 9, wherein the fourth metal layer comprises at least one of molybdenum (Mo) or titanium (Ti).

12. The organic light emitting diode display of claim 9, wherein the third and fourth metal layers of the light reflection pattern are arranged in an alternating order.

13. The organic light emitting diode display of claim 7, further comprising a transparent metal layer below the light reflection pattern.

14. The organic light emitting diode display of claim 13, wherein the light reflection pattern comprises at least one of indium tin oxide (ITO) or indium zinc oxide (IZO).

* * * * *